(12) United States Patent
Colinge et al.

(10) Patent No.: US 9,698,270 B2
(45) Date of Patent: Jul. 4, 2017

(54) FINFET WITH DUAL WORKFUNCTION GATE STRUCTURE

(71) Applicant: Taiwan Semiconductor Manufacturing Co., Ltd., Hsin-Chu (TW)

(72) Inventors: Jean-Pierre Colinge, Hsinchu (TW); Wen-Hsing Hsieh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 16 days.

(21) Appl. No.: 15/054,925

(22) Filed: Feb. 26, 2016

(65) Prior Publication Data

US 2016/0181429 A1 Jun. 23, 2016

Related U.S. Application Data

(62) Division of application No. 13/756,790, filed on Feb. 1, 2013, now Pat. No. 9,276,114.

(51) Int. Cl.
*H01L 29/66* (2006.01)
*H01L 29/78* (2006.01)
*H01L 29/06* (2006.01)
*H01L 29/423* (2006.01)
*H01L 29/49* (2006.01)
*H01L 21/8238* (2006.01)

(52) U.S. Cl.
CPC ...... *H01L 29/7856* (2013.01); *H01L 29/0649* (2013.01); *H01L 29/42364* (2013.01); *H01L 29/42372* (2013.01); *H01L 29/4958* (2013.01); *H01L 29/66795* (2013.01); *H01L 29/785* (2013.01); *H01L 29/7851* (2013.01); *H01L 21/823842* (2013.01)

(58) Field of Classification Search
CPC .......................... H01L 29/66484; H01L 29/78
See application file for complete search history.

(56) References Cited

U.S. PATENT DOCUMENTS

2004/0235300 A1  11/2004  Mathew et al.
2007/0063224 A1*  3/2007  Watanabe ....... H01L 21/823412
                                              257/204

* cited by examiner

*Primary Examiner* — Ori Nadav
*Assistant Examiner* — Ernest Allen, III
(74) *Attorney, Agent, or Firm* — Haynes and Boone, LLP

(57) ABSTRACT

A semiconductor device includes a substrate having a fin structure, the fin structure having a height in a substantially perpendicular direction to the substrate, and having consecutive upper and lower portions along the height, the lower portion being closer to the substrate than the upper portion. The semiconductor device further includes a gate structure wrapping around a portion of the fin structure, the gate structure having a gate dielectric layer disposed around the fin structure, and a gate electrode layer disposed over the gate dielectric layer. The gate electrode layer includes a first gate metal layer formed along both sides of the lower portion of the fin structure, the first gate metal layer having a first workfunction, and a second gate metal layer formed disposed over the first gate metal layer and wrapped around the upper portion of the fin structure, the second gate metal layer having a second workfunction. The first and the second workfunctions are different.

20 Claims, 8 Drawing Sheets

FINFET WITH DUAL WORKFUNCTION GATE STRUCTURE

PRIORITY INFORMATION

This application is a divisional of U.S. patent application Ser. No. 13/756,790 filed Feb. 1, 2013, entitled "FinFET with a Dual Workfunction Gate Structure," the disclosure of which is hereby incorporated by reference in its entirety.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like multigate field effect transistors (FinFET, multigate, triage, gate-all-around devices). The use of multigate (FinFET) devices has been gaining popularity in the semiconductor industry. FinFET devices offer several advantages over traditional Metal-Oxide Semiconductor Field Effect Transistor (MOSFET) devices (also referred to as planar devices). These advantages may include better chip area efficiency, improved carrier mobility, improved speed/energy efficiency, and fabrication processing that is compatible with the fabrication processing of planar devices. Thus, it may be desirable to design an integrated circuit (IC) chip using FinFET devices for a portion of, or the entire IC chip.

A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

For MOSFET or FinFET devices, on state current ("$I_{on}$") and off-state leakage current ("$I_{off}$") directly depends on threshold voltage of the gate ("$V_{th}$"). For high speed switching operation, $V_{th}$ should be low, which results in high $I_{on}$, and at the same time, high $I_{off}$ as well. So the lower limit of the $V_{th}$ is set by the permissible magnitude of $I_{off}$.

On the other hand, for lower power consumption devices, $V_{th}$ is high, which will lower both $I_{on}$ and $I_{off}$. The ratio of $I_{on}$ and $I_{off}$ is known as figure of merit for MOSFETs and higher value of $I_{on}/I_{off}$ is desirable because high $I_{on}$ would result in higher current drive and lower $I_{off}$ would result in low static power dissipation.

Although one cannot obtain high Ion and low Ioff at the same time with the current supply voltages (which have been reduced to reduce dynamic power consumption), and therefore, has to pick either a high Ion or a low Ioff for different transistors, depending on specific needs (speed or low-power), it is desirable if a single chip has all high-speed (low Vth), lower consumption (medium Vth), and low standby power (high Vth) devices in it. High speed devices would consume more energy but provide lots of current for data paths where speed performance is needed, while low standby power is important for mobile devices (memory, etc.). For that, circuit designers would want a scheme of easily obtaining full "palette" of Vths to choose from.

There have been various attempts to control or tune $V_{th}$ by changing the work function of a gate stack, which is usually a constant for a given device. One of such attempts is to adjust doping by using high doping concentrations in the gate material, and thereby change work function. Polysilicon has been used for such doping. Polysilicon, however, is not favorable as gate material for smaller dimension, or short channel devices because of its high thermal budget process, degradation due to the gate depletion of the doped polysilicon, and dopant penetration problems. Further, $V_{th}$ can be tuned through doping the channel region, but this typically introduces variability problem known as random-doping fluctuations ("RDF") and reduction of mobility of channel carriers. As an alternative for obtaining a different range of $V_{th}$, metal layers coupled with the use of high-k dielectric came to be used in place of polysilicon. This alternative, however, has also its own shortcomings that the using different gate metal to achieve different Vth values layers greatly increases process complexity and cost.

Therefore, there is a need to provide a method for fabricating a semiconductor device, such as a FinFET, where a wide range of gate threshold voltage can be obtained by varying workfunctions of gate materials with ease, and without the shortcomings associated with the current art described above.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
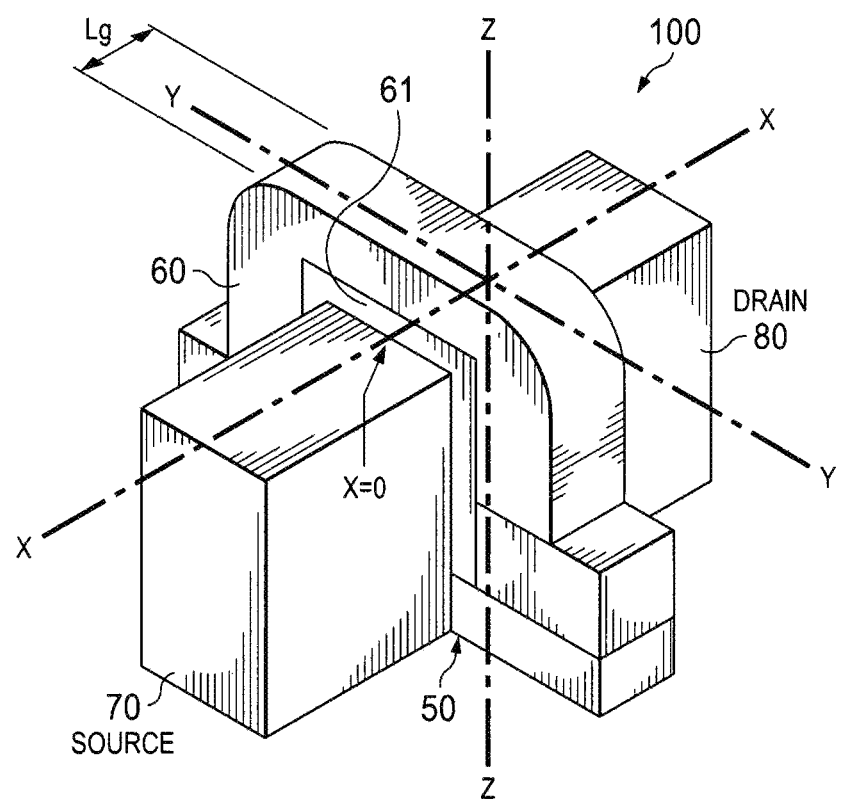
FIG. 1 is a perspective schematic view of a portion of a multigate device (including a FinFET, trigate, pi-gate, omega-gate, gate-all-around—hereinafter, the generic term "FinFET" is used to denote all these family of devices) to be fabricated in accordance with aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

The various aspects of the present disclosure involve fabricating a FinFET device having a gate structure comprising two overlying metal layers of different workfunctions. The two metal layers cover portions of the fin sidewall, respectively of different heights, in parallel to the channel current flow direction, to control threshold gate voltages ("$V_{th}$") of the respective portions. The present disclosure is also directed a method of tuning $V_{th}$ by using two metals of different workfunctions, and more specifically, by varying the thicknesses of at least one metal layer to tune the amount of fin area covered by each metal layer. By varying the thickness of the bottom gate metal, for instance, the effective workfunction of the gate varies between two respective values of workfunctions of the two metals, and consequently the resulting overall $V_{th}$ can be varied.

Now referring to FIGS. 1-6, FIG. 1 is a perspective, schematic, external view of a FinFET device 100. The FinFET device 100 is a non-planar multi-gate transistor that is built on a substrate. A thin silicon "fin-like" structure 50 (or, referred to as fin) forms the body of the FinFET device 100. A gate structure, or gate stack of the FinFET device 100 comprises basically two parts, a gate dielectric layer 61 and a gate electrode 60, and is wrapped around this fin structure 50. In the figure, the fin structure 50 has a height in Z direction, and width in Y direction. 'Lg' denotes the length of the gate structure 60, and corresponds to the length of the channel region 50, which is formed below the gate structure 60 inside the fin structure 50, and extended into the X direction from the point X=0. A source 70 and a drain 80 of the FinFET device 100 are formed in extensions of the fin structure 50 on opposite sides of the gate structure 60. The effective channel length of the FinFET device 100 is determined by the dimensions of the gate electrode 60

Figure 2:
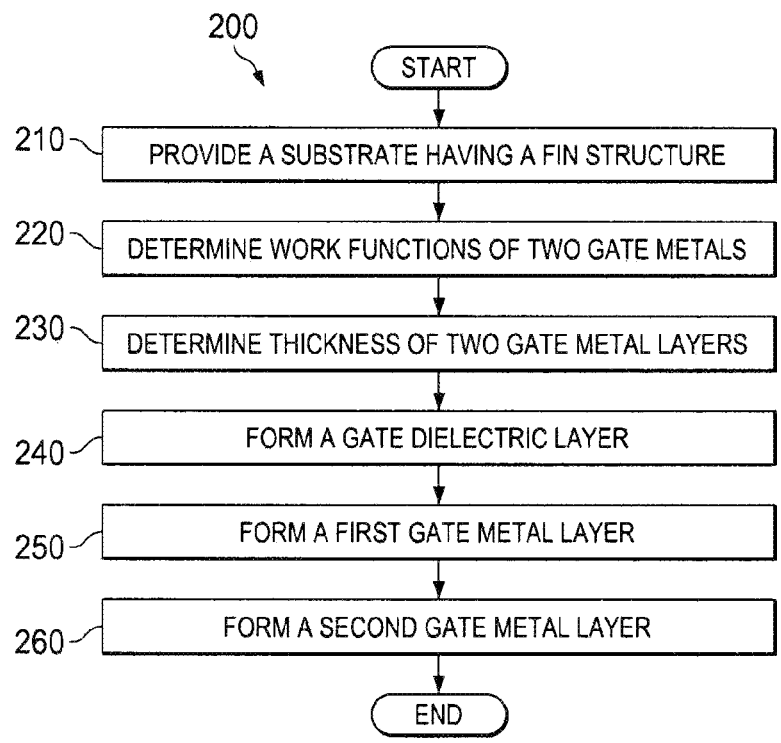
FIG. 2 is a flowchart of a process for fabricating a FinFET device in accordance with aspects of the present disclosure.
Figure 3A:
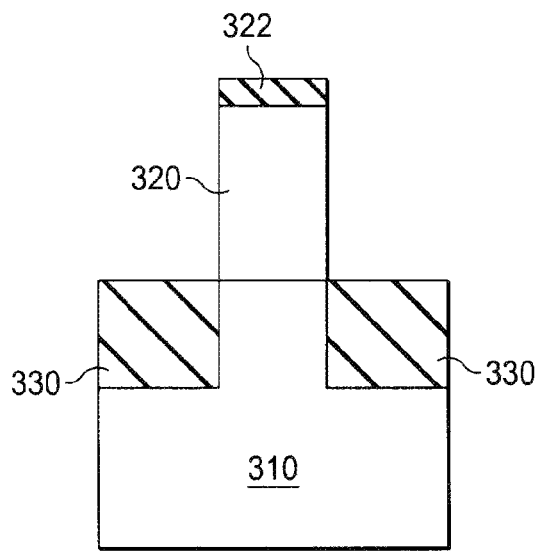
FIG. 3(a)-(h) is a schematic illustration of one embodiment of forming two metal gate layers over a fin structure in a FinFET device to be fabricated in accordance with aspects of the present disclosure.

FIG. 2 is a flowchart of a process 200 for fabricating a FinFET device in accordance with aspects of the present disclosure. At step 210, a substrate having a fin structure is provided. Here, provision of the substrate with a fin structure is meant in a broad sense for acquiring the same by any means, which may include, but is not limited to, fabrication of the substrate with a fin structure or preparation of a prefabricated one. FIG. 3(a) shows a schematic cross-sectional view of a substrate 310 with a fin structure 320 taken at Y-Z plane in FIG. 1 according to an aspect of the present disclosure.

The substrate 310 comprises, in one embodiment, silicon in a crystalline structure. Alternatively, it may comprise other suitable elementary semiconductors, such as germanium; a semiconductor alloy, such as simicon-germanium, gallium arsenide, gallium phosphide, indium phosphide, indium arsenide, and/or indium antimonide; or combinations thereof. The substrate 310 may also include a semiconductor-on-insulator (such as SOI) wafer. The insulator layer comprises any suitable material, including silicon oxide, sapphire, other suitable insulating materials, and/or combinations thereof. An exemplary insulator layer may be a buried oxide layer (BOX). The insulator is formed by any suitable process, such as implantation (e.g., SIMOX), oxidation, deposition, and/or other suitable process or bonding and exfoliating (e.g. Smart-CUT™). In some exemplary FinFET devices, the insulator layer is a component (e.g., layer) of a silicon-on-insulator substrate.

Alternatively, the substrate 310 may further include another semiconductor layer on top of an insulator layer to form a silicon-on-insulator (SOI) substrate, which can be fabricated using separation by implantation of oxygen (SIMOX), wafer bonding, and/or other suitable methods. The substrate 310 may comprise any suitable crystallographic orientation (e.g., a (100), (110) or (111) crystallographic orientation). In an embodiment, the top semiconductor layer may include a crystal silicon material.

The substrate 310 may include various doped regions formed by an implantation process depending on design requirements as known in the art (e.g., p-type wells or n-type wells). The doped regions are doped with p-type dopants, such as boron or BF2; n-type dopants, such as phosphorus or arsenic; or combinations thereof. The doped regions may be formed directly on the substrate 310, in a P-well structure, in a N-well structure, in a dual-well structure, or using a raised structure. The semiconductor substrate 310 may further include various active regions, such as regions configured for an N-type metal-oxide-semiconductor transistor device and regions configured for a P-type metal-oxide-semiconductor transistor device.

The fin structure will serve as a conductive channel for a FinFET device. It is formed over a substrate, and may comprise one or more fins. In the present embodiment, schematically shown in FIGS. 1 and 3(a), the fin structure 320 has a single fin for simplicity. The fin may comprise any suitable material, for example, a silicon (Si-fin) as shown in FIG. 3(a).

The fin structure 320 may be formed by any suitable process including various deposition, photolithography, and/or etching processes. An exemplary photolithography process may include forming a photoresist layer (resist) overlying the substrate (e.g., on a silicon layer), exposing the resist to a pattern, performing a post-exposure bake process, and developing the resist to form a masking element including the resist. The masking element may then be used to etch the fin structure into the silicon layer. FIG. 3(a) shows a hard mask layer 322, composed of silicon nitride ($Si_3N_4$) and formed on top of the fin structure 320 before fin etching. The hard mask layer 322 may be by any suitable process. The hard mask layer 322 may comprise any suitable material, for example, silicon nitride, SiON, a low-k film, tetraethylorthosilicate (TEOS), plasma enhanced CVD oxide (PE-oxide), and/or other suitable material.

The fin structure 320 may be etched using reactive ion etching (RIE) processes and/or other suitable processes. In an example, the silicon fin is formed by patterning and etching a portion of the silicon substrate. In another example, silicon fins of the fin structure may be formed by patterning and etching a silicon layer deposited overlying an insulator layer (for example, an upper silicon layer of a silicon-insulator-silicon stack of an SOI substrate). It is understood that multiple parallel fin structures may be formed in a similar manner. Alternatively, the fin structure 320 is formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets), forming spacers adjacent features and removing the features to provide a pattern of spacers, resist freezing, and/or other suitable processes.

Also shown in FIG. 3(a) is isolation regions 330 formed on the substrate 310 to isolate various regions of the substrate 310. The isolation region 330 utilizes isolation technology, such as shallow trench isolation (STI), to define and electrically isolate the various regions. The isolation region 330 comprises silicon oxide (SiO$_2$), silicon nitride, silicon oxynitride, other suitable materials, or combinations thereof. The isolation region 330 is formed by any suitable process. As one example, the formation of an STI includes a photolithography process, etching a trench in the substrate (for example, by using a dry etching and/or wet etching), and filling the trench (for example, by using a chemical vapor deposition process or a spin-on glass material) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide.

Now, at step 220, before a gate structure is formed over the fin structure, it is determined what kind of metals to be used for the two gate layers forming the gate structure. This is equivalent to determining the values of two individual workfunctions for the gate material. Further, at step 230, the thicknesses of individual metal layers that cover different portions of the fin sidewall are determined.

$V_{th}$ of a MOSFET or FinFET generally depends on the workfunction difference between the gate and the channel region. Therefore, $V_{th}$ is determined and not adjustable once the devices have been fabricated with a chosen gate material, structure and fin dimension. One can obtain different $V_{th}$ values by using a gate material of different workfunction. It is desirable to be able to make devices with different threshold voltages on a same chip because one can then mix low-power devices (high $V_{th}$, low off-state, or leakage current ("$I_{off}$"), but slow devices of low on-state, or drain current ("$I_{on}$")) with high-speed devices (low $V_{th}$, high Ion, but energy-hungry devices of high $I_{off}$). In the present disclosure a FinFET having two different threshold voltages is disclosed. By forming a gate stack with two metals of different workfunctions that cover different portion of the fin surface respectively, one can fabricate different devices with different $V_{th}$ at the upper and lower portions of the fin, which respectively control $I_{on}$ and $I_{off}$ within the respective portions of the fin.

One can change the relative coverage of the fin sidewall by two individual layers of metals, which affects the individual $V_{th}$ at the upper and lower portions of the fin, and ultimately the effective $V_{th}$ of the device, among several methods, by varying the thickness of each layer. Consider two layers of metals, metal 2 on top of metal 1. If the coverage of metal 1 is zero, the resulting workfunction would be just that of metal 2. If metal 1 covers the entire fin surface, the resulting workfunction would be that of metal 1. As metal 1's relative amount of coverage changes between zero and 100 percent, the resulting Vth will change as the workfunction accordingly changes between those of metal 2 and metal 1. Therefore, by changing the fin coverage of a bottom metal layer, the workfunction can be changed continuously from that of one metal to the other, and one can tune the effective $V_{th}$ of the gate to vary between two boundary values determined by two workfunctions of the metals. If the workfunction of the bottom metal layer increases with that of the top metal layer fixed (assuming an n-channel device), the $I_{on}$ of the lower portion of the fin will decrease, and accordingly the current density, so both the $I_{on}$ and $I_{off}$ of the lower portion will decrease with respect to that of the upper portion. As a result, the overall Vth of the device will be larger than when only metal 2 was used as gate material. Opposite behavior is obtained using p-channel devices.

At steps 220 and 230, the optimum values for workfunctions of gate metals and/or their thicknesses covering the sidewall of a fin in relation to a gate threshold voltage may be determined by a computer simulation. The simulation may be performed using standard TCAD tools.

Figure 6:
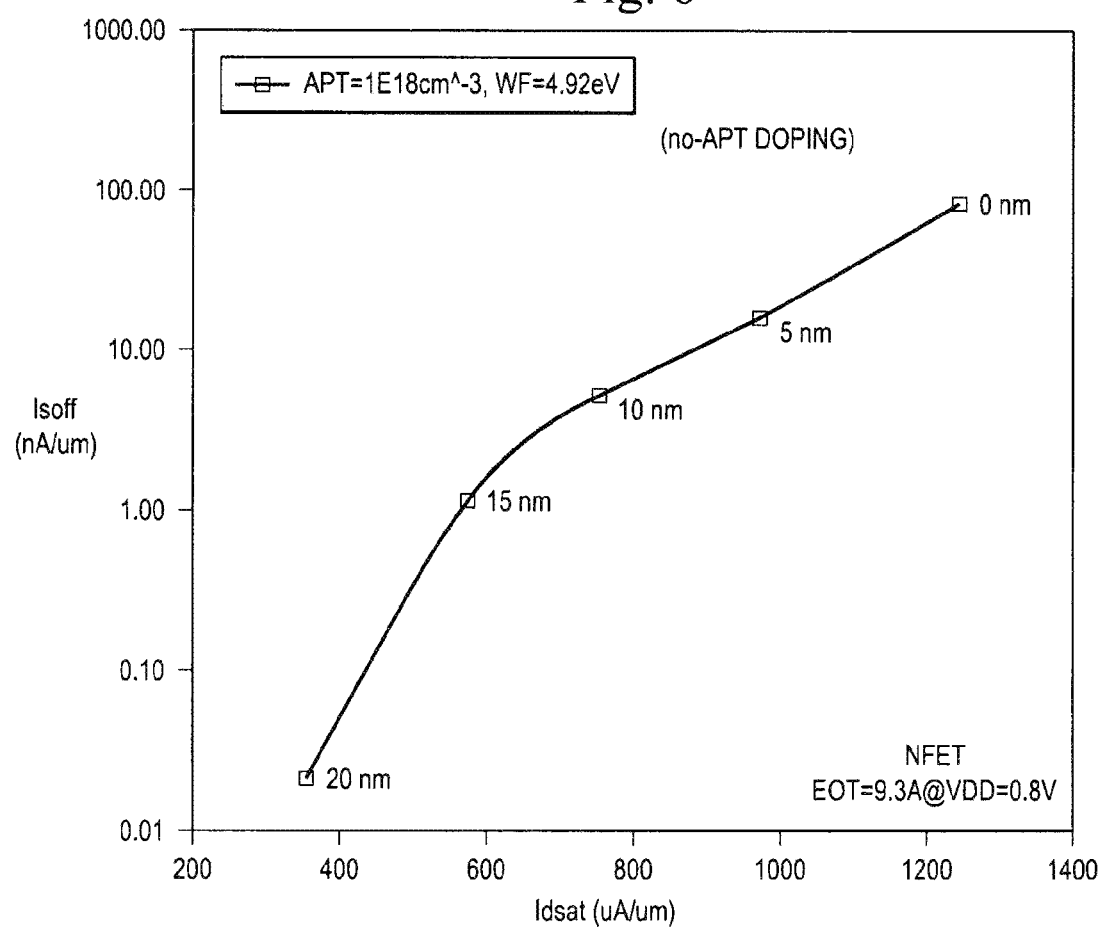
FIG. 6 is an $I_{on}$-$I_{off}$ characteristics curve of a multi-$V_{th}$ FinFET device, obtained from a computer simulation that has been performed in accordance with aspects of the present disclosure.

FIG. 6 shows an example of such a simulation for designing a controlled multi-$V_{th}$ device (FinFET), in which $I_{on}$-$I_{off}$ characteristics curve is seen to change as the coverage (thickness) of a bottom metal layer is varied. This simulation has been performed for a nMOS (or n-FET) with the following parameters: fin height=25 nm; gate stack length, Lg=26 nm; workfunction of N- metal bottom layer, $WF_{N-}$=4.92 eV; workfunction of N metal top layer, $WF_{N}$=4.45 eV; thicknesses of N- metal bottom layer (fin side coverage)=0, 5, 10, 15, and 20 nm; power supply voltage, $V_{DD}$=0.8 V, equivalent gate oxide thickness (EOT)=0.93 nm. Further, it is assumed that there is no $V_{th}$-tuning using additional ion implantation on the fin. Embodiments for a pMOS (or p-FET) can be similarly derived by reversing the gate and doping polarities.

One can see that as the fin coverage (labeled "thickness") of the N- metal bottom layer increases, $I_{on}$ and $I_{off}$ decrease, which is equivalent to an increase of $V_{th}$. Through this sort of simulation graph, one can design devices having a dual workfuction metal gate with $V_{th}$ of a wide range as desired for a particular need. Or vice versa, through the same graph, one can determine optimum values of the individual workfunctions of dual gate metals and/or thicknesses (fin side coverage) of individual metal layers at steps 220 and 230.

Now referring back to FIG. 2, once the kind of gate metals and their thicknesses or their extents of coverage over fin sidewall are determined at step 220 and 230, then a gate structure is formed over the fin structure that has been provided at step 210. As schematically illustrated in FIG. 1, the gate structure 60 of a FinFET to be fabricated in an embodiment of the present disclosure is configured to wrap around the fin structure 50. The portion of the fin structure being wrapped around by the gate structure constitutes a conductive channel region according to an embodiment. In FIG. 1, the gate structure 60 has a length measured in the X direction. The gate structure may be formed by any suitable process known in the art, including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process may be implemented or replaced by other proper methods such as maskless photolithography, electron-beam writing, and ion-beam writing. The etching processes may include dry etching, wet etching, and/or other etching methods (e.g., reactive ion etching).

Figure 3B:
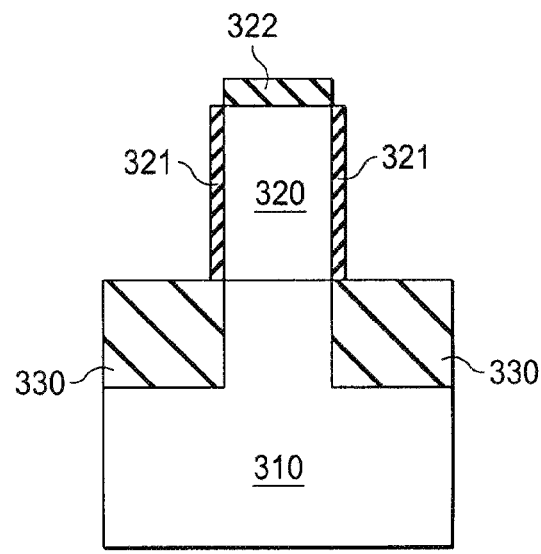
Figure 4A:
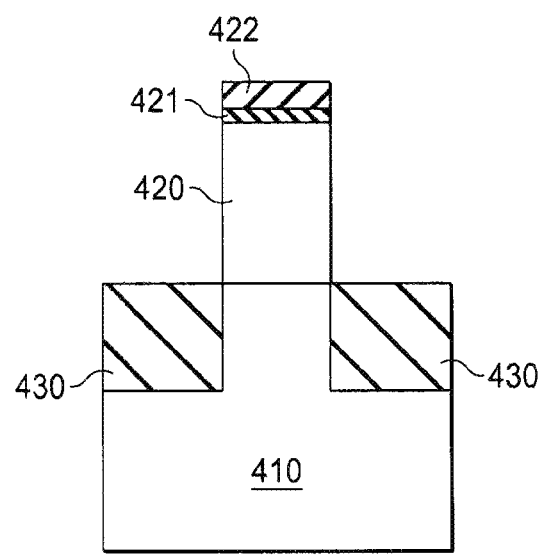
FIG. 4(a)-(f) is a schematic illustration of another embodiment of forming two metal gate layers over a fin structure in a FinFET device to be fabricated in accordance with aspects of the present disclosure.
Figure 4B:
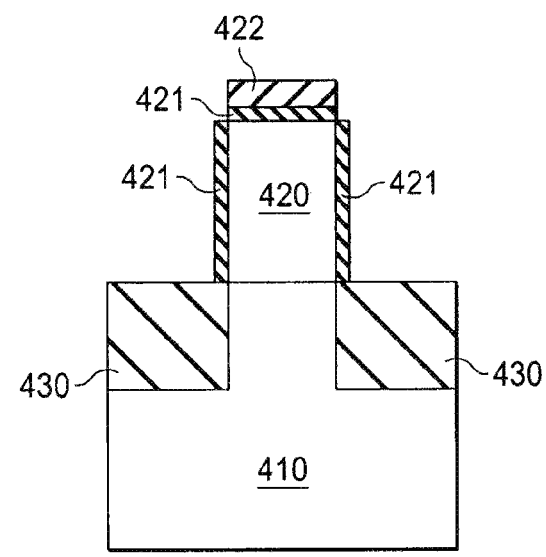
Figure 5A:
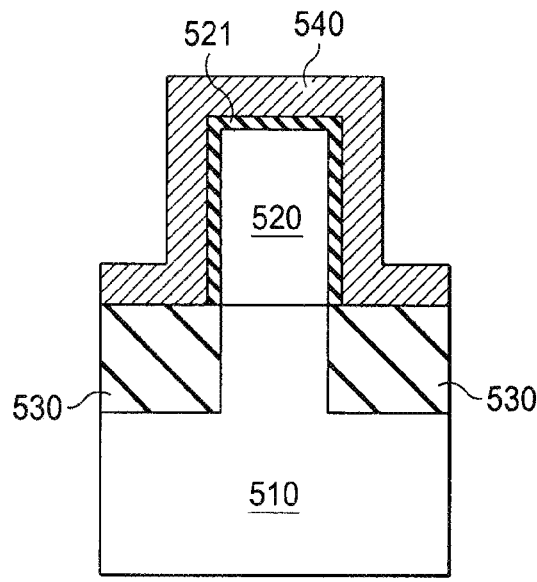
FIG. 5(a)-(h) is a schematic illustration of still another embodiment of forming two metal gate layers over a fin structure of a FinFET device to be fabricated in accordance with aspects of the present disclosure.
Figure 5B:
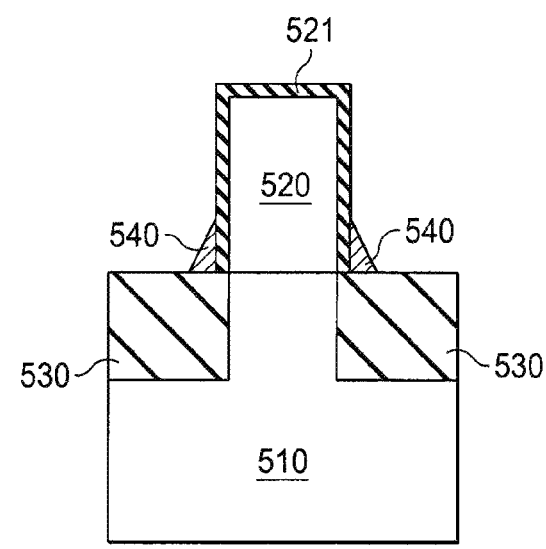
Figure 5C:
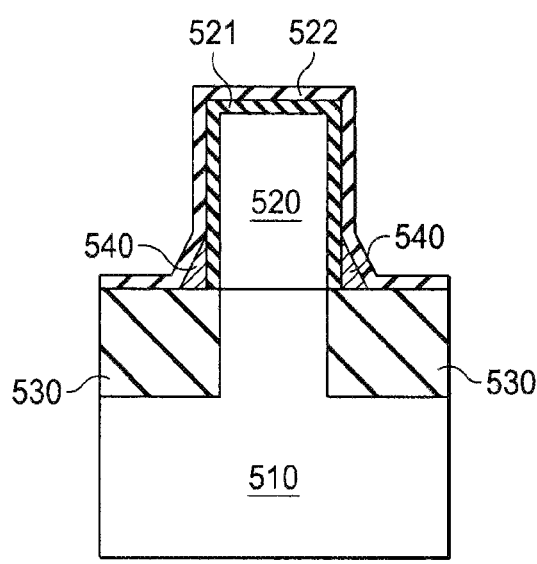
Figure 5D:
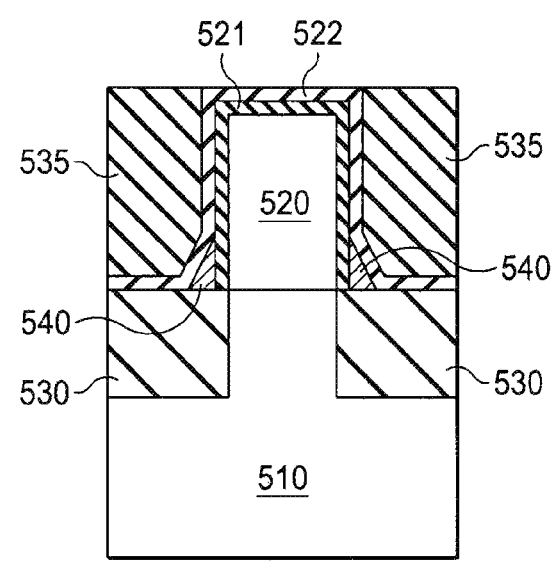
Figure 5E:
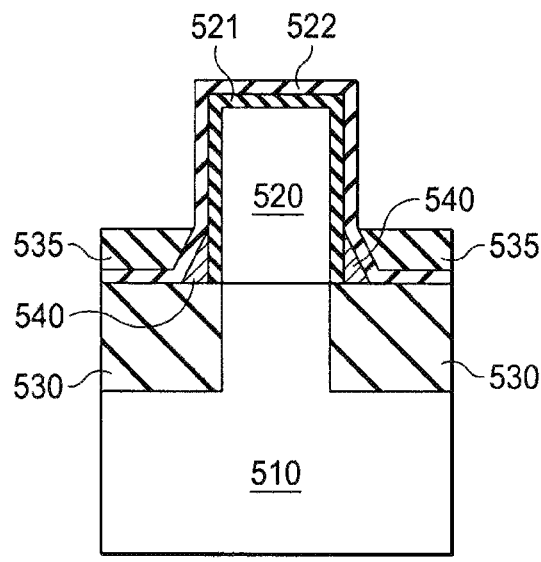
Figure 5F:
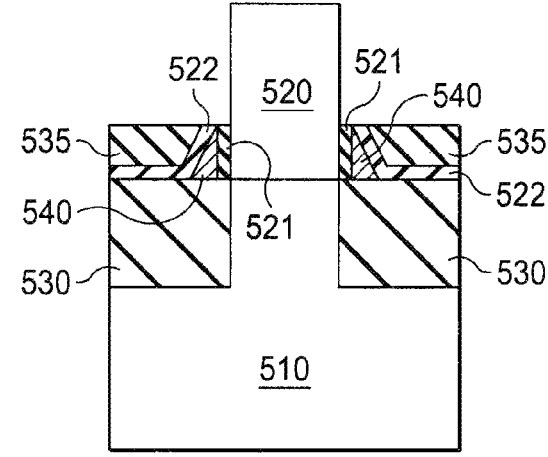
Figure 5G:
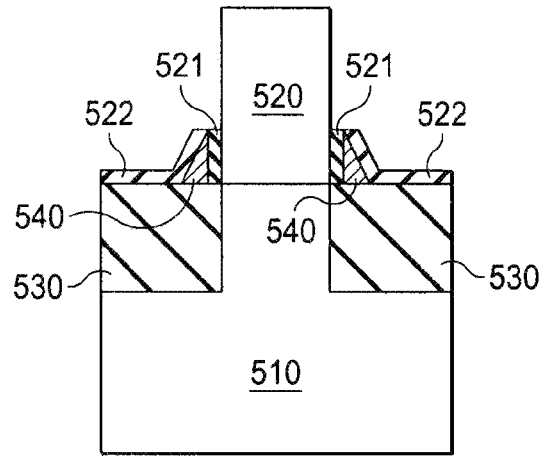
Figure 5H:
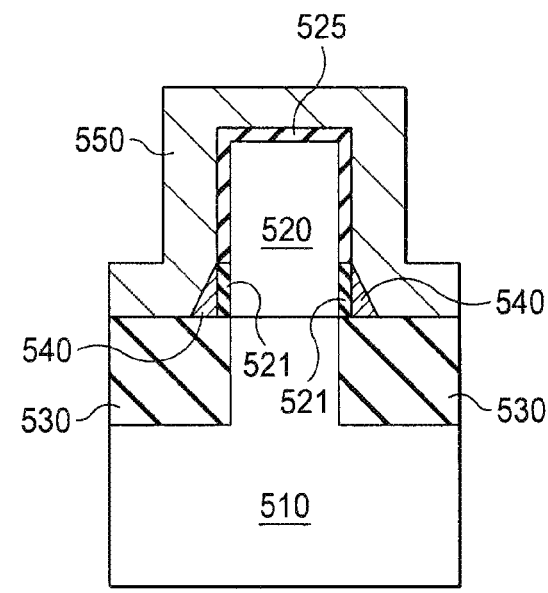

In an embodiment, the gate structure may be formed, by starting with, at step 240, forming a gate dielectric layer around the fin structure. FIG. 3(b), 4(b), and 5(a) show such gate dielectric layers 321, 421, 521, respectively, formed around the respective fin structures 320, 420, 520. In embodiments shown in these figures, the gate dielectric layer may be comprised of silicon oxide and formed by a thermal or chemical growth process. The gate dielectric layers 321, 421, 521 may be formed by any other suitable process known in the art, such as atomic layer deposition (ALD).

The gate dielectric layer may comprise any known dielectric material, such as silicon oxide, silicon nitride, silicon oxynitride, high-k dielectric material, other suitable dielectric material, and/or combinations thereof. Examples of high-k dielectric material may include a hafnium oxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Further, it should be understood that the gate structure may comprise layers additional to the gate dielectric layer 321, such as interfacial layers, capping layers, diffusion/barrier layers, dielectric layers, conductive layers, other suitable layers, and/or combinations thereof.

After the gate dielectric layer is formed, a gate electrode layer is formed over the gate dielectric layer. In the present disclosure, the gate electrode layer comprises to overlying layers of metals of different workfunctions. Referring back to FIG. 2, at step 250, a first gate metal layer (noted N- in FIG. 6) is formed adjacent the lower portion of the fin structure. The gate metal layers in the present disclosure is distinguished from prior art that uses two metal gate layers for variable gate workfunction. In the prior art, two separate gate metals of different workfunctions, such as tungsten and molybdenum, were connected in series along the channel of a FinFET between the source and drain regions, so that each layer extends along only part of the length of the channel. By contrast, the gate metal layers in the present disclosure are formed parallel to the current flow direction, meaning that each gate metal layer is extended along substantially the entire length of the channel, each extending from source to drain.

Figure 3C:
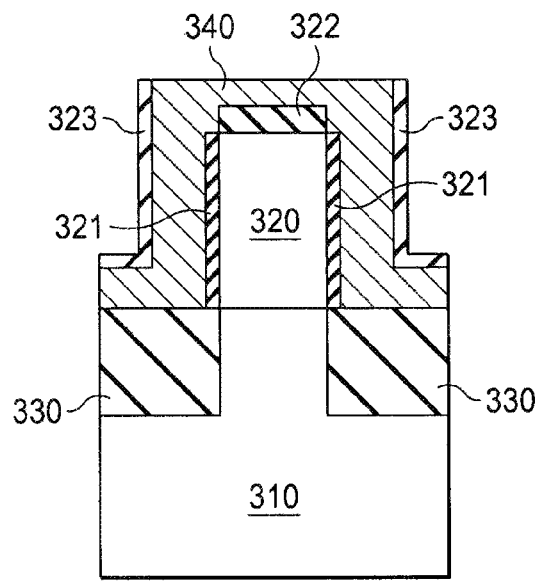
Figure 3D:
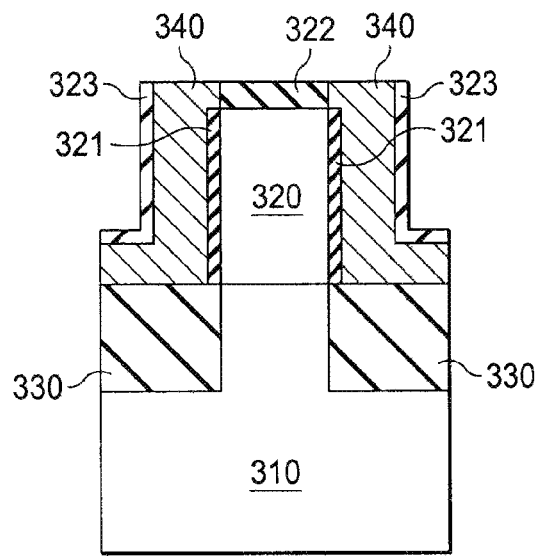

The process of forming the first gate metal layer may comprise several sub-processes which may be different depending on different embodiments of the present disclosure. FIG. 3(c)-(g) schematically describe such a sub-processes performed in one embodiment of the present disclosure. As shown in FIG. 3(c), the first metal 340, a silicon nitride, and a silicon dioxide layers may be sequentially deposited upon the gate dielectric layer 321, the isolation regions 330, and the silicon nitride (Si3Ni4) hard mask 322. The deposition processes may include chemical vapor deposition (CVD), physical vapor deposition (PVD), atomic layer deposition (ALD), molecular beam epitaxy (MBE), high density plasma CVD (HDPCVD), metal organic CVD (MOCVD), remote plasma CVD (RPCVD), plasma enhanced CVD (PECVD), plating, other suitable methods, and/or combinations thereof. After the deposition, another dielectric layer 323 used for a spacer may be further deposited upon the first metal 340 by a suitable deposition process. Then, the upper part of the first metal 340 above the fin structure 320 is removed together with the gate dielectric layer 321, to the level of the hard mask 322, as shown in FIG. 3(d), by the process of Chemical Mechanical Polishing/Planarization ("CMP"), a process of smoothing surfaces with the combination of chemical and mechanical forces. In the latest 65 nm technology, CMP process can remove and planarize a surface to sub-nanometer levels.

Figure 3E:
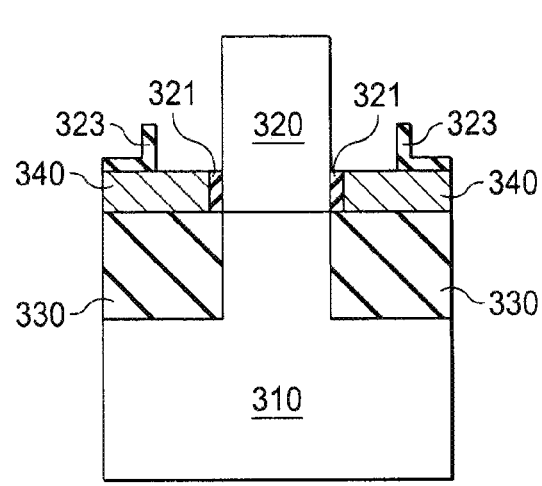

FIG. 3(e) shows the first metal layer 340 formed along the side of the lower portion of the fin structure 320. Although not shown in FIG. 3 (a)-(h), which are cross-sectional views of the gate structure and the substrate 310 taken at of Y-Z plane in FIG. 1, the first metal layer 340 extends along substantially the entire length of the channel 320 (along X direction in FIG. 1). The first metal layer 340 shown in FIG. 3(e) may be formed by a series of a CMP process to remove the hard mask layer 322, and several etching processes to remove upper parts of the first metal layer 340, the gate dielectric layer 321, and the spacer 323.

Etching processes used for removing a given layer are well known in the art. In the embodiments in the present disclosure, any known etching processes may be used, such as wet etching, dry etching, or plasma etching. The etchants that may be used include, but are not limited to, wet etchants, or plasma etchants such as $Cl_2$, $CCl_4$, $SiCl_2$, $BCl_3$, $CCl_2F_2$, $CF_4$, $SF_6$, or $NF_3$.

Figure 3F:
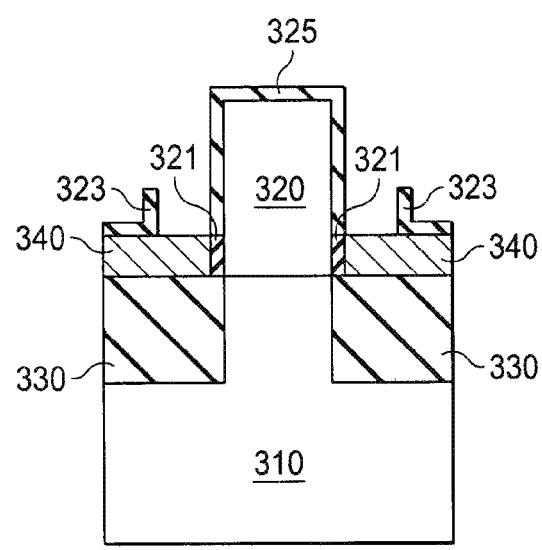
Figure 3G:
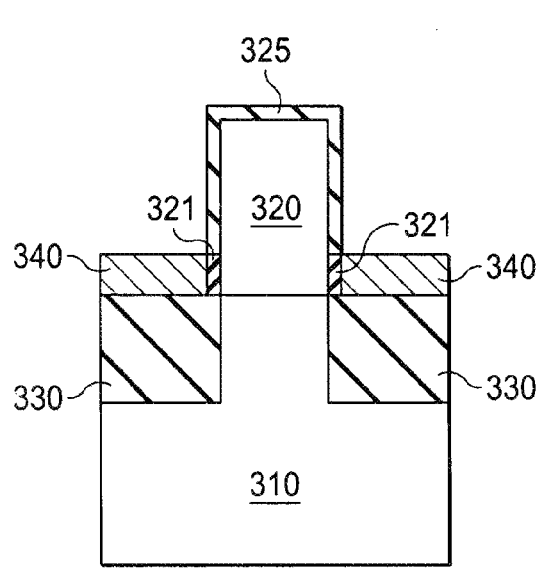

In an embodiment, after the first metal layer 340 is formed a dielectric material 325 may be further deposited upon the fin structure 320 by, for example, atomic layer deposition or thermal growth, as shown in FIG. 3(f) to complete the formation of the gate dielectric layer 321 and 325. FIG. 3(g) shows the completely formed first metal layer 340 with the gate dielectric layer 321 after removal of any remaining spacer 323 shown in FIG. 3(f) by, for example, wet etching.

Figure 3H:
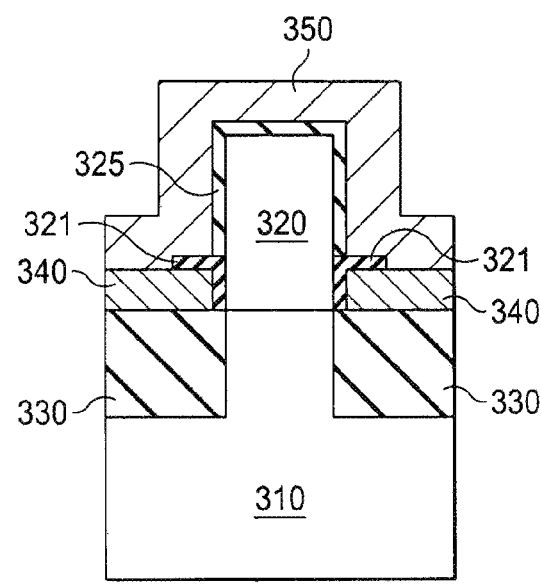

After the formation of the first metal layer 340, then at step 260 in FIG. 2, a second gate metal layer 350 is formed along the sidewall and top of the upper portion of the fin structure 320. The second gate metal has a different work function from the first gate metal, and like the first metal, is deposited upon the first metal layer 340 and upon the gate dielectric layer 321 and 325 as shown in FIG. 3(h), by any of known deposition process discussed herein.

Figure 4C:
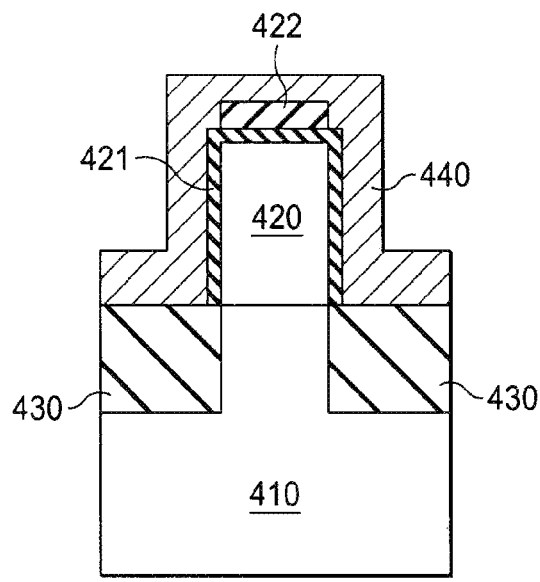
Figure 4D:
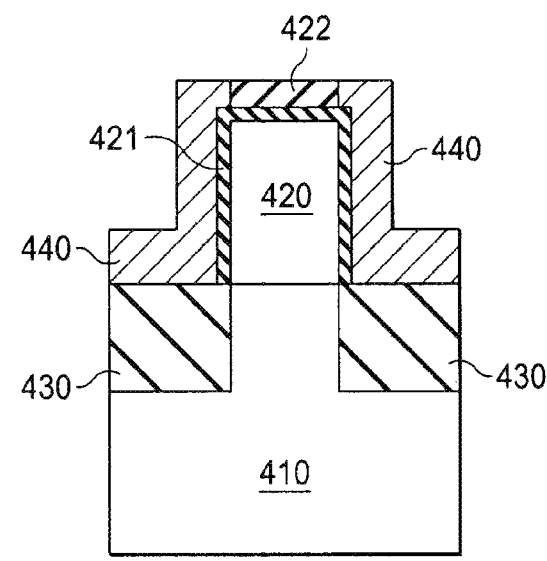
Figure 4E:
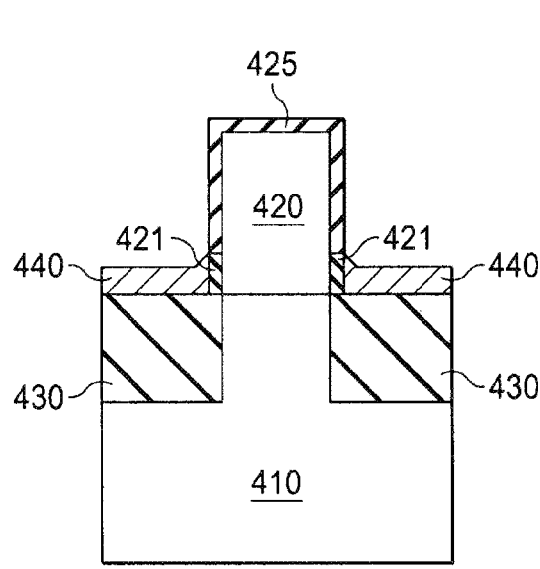
Figure 4F:
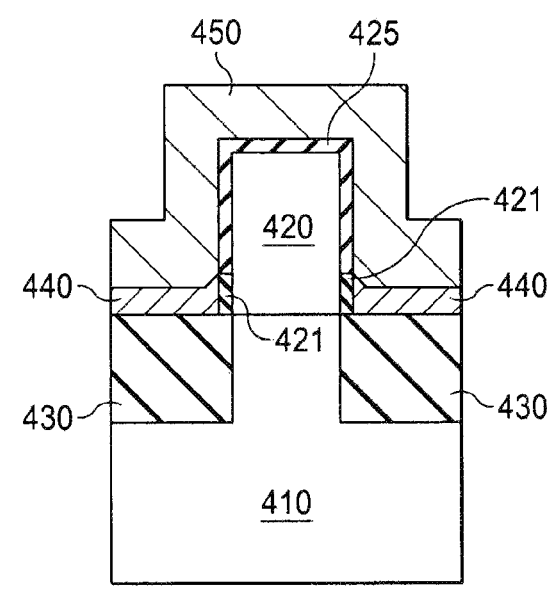

The steps 250 and 260 of forming the first and second metal gate layers described in a particular example in FIG. 3 may be performed via a different sequence of sub-processes in other embodiments. FIG. 4(a)-(f) schematically illustrate another embodiment in the present disclosure of forming the first and second metal gate layers. In this embodiment, the substrate 410 and the fin structure 420 are formed as shown in FIG. 4(a) and a gate dielectric layer 421 is formed as shown in FIG. 4(b) according to the similar processes described in FIG. 3(a). Then the first metal 440 may be deposited upon the gate dielectric layer 421, the isolation regions 430, and the silicon nitride (Si3Ni4) hard mask 422 to form a layer as shown in FIG. 4(c). The upper portion of the first metal layer 440 may be removed to the level of the hard mask layer 422 by a CMP process as shown in FIG. 4(d). Next, as shown in FIG. 4(e), suitable etching processes may further remove the hard mask layer 422, and partially the first metal layer 440 and the gate dielectric layer 421. In an embodiment, the etching process used for removing the first metal layer 440 may be an anisotropic etching to define sharp, well-controlled features as shown in FIG. 4(e). Then, a gate dielectric material 425 may be further deposited upon the fin structure 420 by, for example, epitaxial growth, to complete the formation of the gate dielectric layer 421 and 425. Lastly, a second gate metal 450 of different workfunction is deposited upon the first metal layer 440 and upon the gate dielectric layer 421 and 425 in FIG. 4(f) by similar deposition processes used for the first metal layer 440. Again the deposition process in this embodiment may be any deposition process known in the art described hereinbefore.

FIG. 5 (a)-(h) schematically illustrate still another embodiment in the present disclosure of forming the first and second metal gate layers at steps 250 and 260 of FIG. 2. In this embodiment, the substrate 510, the fin structure 520, and the gate dielectric layer 521 are successively formed by similar processes described herein in FIGS. 3 and 4. Then the first metal layer 540 is formed upon them by one of deposition processes. FIG. 5(a) shows such layers that have been formed. The first metal layer 540 is then etched out by a spacer-like etching, leaving a sharp-edged portion adjacent the lower portion of the fin structure 520 to form a completed first metal layer 540 as shown in FIG. 5(b). Next, silicon nitride is deposited upon the gate dielectric layer 521 and the first metal layer 540 to form a hard mask layer 522 as shown in FIG. 5(c). Next, silicon oxide 535 is deposited thereupon as shown in FIG. 5(d), which is then removed to the level of the first metal layer 540 by a CMP process as shown in FIG. 5(e). Next, the hard mask layer 522 and the gate dielectric layer 521 covering the gate structure are successively etched off to the level of the first metal layer 540, respectively resulting in FIGS. 5(f) and (g). Next, the remaining hard mask layer 522 shown in FIG. 5(g) is removed by etching, a gate dielectric material 525 is further deposited upon the fin structure 520 by, for example, epitaxial growth, to complete the formation of the gate dielectric layer 521 and 525, and lastly, a second gate metal 550 of different workfunction is deposited upon the first metal layer 540 and upon the gate dielectric layer 521 and 525 by any of known deposition process, which ends up with the finished gate structure shown in FIG. 5(h).

The method of fabricating a FinFET device according to the present disclosure provides an alternative to doping methods for controlling either $V_{th}$ or punchthrough while the drawbacks following the doping methods such as reduction of mobility or RDF are eliminated. The method can be also used to impose different threshold voltages at the top and the bottom of the fin of a FinFET device to reduce punchthrough effects or replace the anti-punchthrough (HALO) implant by doping.

It is understood that although the figures discussed above only show a single FinFET device, a plurality of similar FinFET devices may be fabricated on a single wafer or on the same chip. For example, a complementary metal oxide semiconductor (CMOS) device includes both n-FET devices and p-FET devices. Both the n-FET devices and the p-FET devices can be fabricated using the process flow discussed above.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a fin disposed thereon, the fin having a height in a substantially perpendicular direction to the substrate, and the fin having consecutive upper and lower portions along the height, the lower portion being closer to the substrate than the upper portion; and
   a gate structure wrapping around a portion of the fin, the gate structure comprising:
      a first gate dielectric layer in direct contact with the lower portion of the fin; a second gate dielectric layer in direct contact with the upper portion of the fin, the second gate dielectric layer being different in composition than the first gate dielectric layer, and
      a gate electrode layer disposed over the gate dielectric layer, the gate electrode layer comprising:
         a first gate metal layer formed along both sides of the lower portion of the fin over the first gate dielectric layer, the first gate metal layer having a first workfunction; and
         a second gate metal layer disposed over the second gate dielectric layer and wrapped around the upper portion of the fin, the second gate metal layer having a second workfunction;
      wherein the first and the second workfunctions are different.

2. The semiconductor device of claim 1, wherein the semiconductor device is a FinFET.

3. The semiconductor device of claim 1, wherein the first and second workfunctions are obtained from a computer simulation designed for achieving a predetermined value of threshold voltage.

4. The semiconductor device of claim 1, further comprising source and drain regions formed adjacent two opposite ends of the fin, respectively.

5. The semiconductor device of claim 1, wherein the second gate metal layer has a thickness greater than that of the first gate metal layer.

6. A semiconductor device, comprising:
   a substrate having a fin disposed thereon, the fin having a height in a substantially perpendicular direction to the substrate, and having upper and lower portions along the height, the lower portion closer to the substrate than the upper portion; and
   a gate structure that wraps around a portion of the fin, wherein the gate structure comprises:
      a first gate dielectric layer in direct contact with the lower portion of the fin; a second gate dielectric layer in direct contact with the upper portion of the fin, the second gate dielectric layer being different in composition than the first gate dielectric layer, and
      a gate electrode layer over the first gate dielectric layer and the second gate dielectric layer, wherein the gate electrode layer comprises:
         a first gate metal layer over the first gate dielectric layer and along both sides of the lower portion of the fin, the first gate metal layer having a first workfunction, and
         a second gate metal layer disposed over the second gate dielectric layer and wrapped around the upper portion of the fin, the second gate metal layer having a second workfunction, wherein the first and the second workfunctions are different.

7. The semiconductor device of claim 6, wherein the semiconductor device is a FinFET.

8. The semiconductor device of claim 6, wherein the first and second workfunctions of the first gate metal layer and the second gate metal layer achieve a predetermined value of threshold gate voltage.

9. The semiconductor device of claim 6, wherein respective thicknesses of the first and second gate metal layers achieve a predetermined value of threshold gate voltage.

10. The semiconductor device of claim 6, wherein the surface area of the fin covered by the second gate metal layer is greater than that covered by the first gate metal layer.

11. The semiconductor device of claim 6, further comprising, source and drain regions adjacent two opposite ends of the fin, respectively.

12. The semiconductor device of claim 6, further comprising, isolation regions formed on the substrate.

13. The semiconductor device of claim 6, wherein the gate dielectric layer includes a first portion and a second portion, the first portion corresponding to the first gate metal layer and the second portion corresponding to the second gate metal layer.

14. The semiconductor device of claim 6, wherein the semiconductor device is a FinFET.

15. The semiconductor device of claim 6, wherein the second gate metal layer has a thickness greater than that of the first gate metal layer, the thicknesses being measured along the height of the fin.

16. A semiconductor device comprising:
   a substrate having a fin disposed thereon, the fin having a first sidewall surface and an opposing second sidewall surface;
   a gate stack to wrap around a portion of the fin, wherein the stack includes:
      a first gate dielectric layer in direct contact with a lower portion of the first and second sidewall surface of the fin; a second gate dielectric layer in direct contact with an upper portion of the first and second sidewall surface of the fin, the second gate dielectric layer being different in composition than the first gate dielectric layer;
      a first metal gate comprising a first gate metal, the first metal gate formed over the first gate dielectric layer; and
      a second metal gate comprising a second gate metal having a different workfunction than the first gate metal, the second metal gate formed over the second gate dielectric layer.

17. The semiconductor device of claim 16, wherein thicknesses of the first metal gate and the second metal gate achieve a predetermined value of threshold gate voltage.

18. The semiconductor device of claim 16, further comprising source and drain regions adjacent two opposite ends of the fin, respectively.

19. The semiconductor device of claim 16, further comprising isolation regions formed on the substrate.

20. The semiconductor device of claim 16, wherein the second metal gate has a thickness greater than that of the first metal gate, the thicknesses being measured along the height of the fin.

* * * * *